Dec. 11, 1962 J. L. MEDOFF 3,068,462

ANALOG TO DIGITAL CONVERTER

Filed Dec. 1, 1958 6 Sheets-Sheet 1

JOSEPH L. MEDOFF
INVENTOR.

BY Alden D Redfield
Abraham Ogman
ATTORNEYS

ANALOG TO DIGITAL CONVERTER

Filed Dec. 1, 1958 6 Sheets-Sheet 2

A B C

JOSEPH L. MEDOFF
INVENTOR.

BY Alden D Redfield
Abraham Ogman
ATTORNEYS

JOSEPH L. MEDOFF
INVENTOR.
BY Alden D Redfield
Abraham Ogman
ATTORNEYS

ANALOG TO DIGITAL CONVERTER

Filed Dec. 1, 1958 6 Sheets-Sheet 4

JOSEPH L. MEDOFF
*INVENTOR.*

BY *Aldon D Redfield*
*Abraham Ogman*
ATTORNEYS.

Dec. 11, 1962 J. L. MEDOFF 3,068,462

ANALOG TO DIGITAL CONVERTER

Filed Dec. 1, 1958 6 Sheets-Sheet 5

JOSEPH L. MEDOFF
*INVENTOR.*

BY Alden D Redfield
Abraham Ogman
ATTORNEYS

JOSEPH L. MEDOFF
*INVENTOR.*

BY Alden D Redfield
Ahorton Oyman
ATTORNEYS

United States Patent Office 3,068,462
Patented Dec. 11, 1962

3,068,462
ANALOG TO DIGITAL CONVERTER

Joseph L. Medoff, Newton, Mass., assignor to Avco Manufacturing Corporation, Cincinnati, Ohio, a corporation of Delaware
Filed Dec. 1, 1958, Ser. No. 777,434
13 Claims. (Cl. 340—347)

This invention relates to analog to digital conversion devices and in particular to a converter which utilizes a simply constructed magnetic component.

Analog to digital conversion devices are available in several types and in many forms. There is a converter which is electro-mechanical in nature, that is to say, the input is a mechanical analog and the output is an electrical digital converter which overcomes one or more of the limited in its application.

All electronic analog to digital converters, that is to say, converters where the input and output is an electronic signal, are also found in many varieties and forms. There is one common characteristic, however, which limits their use and their field of application. This characteristic is the complexity of the electronic circuitry necessary for performing the conversion and the accompanying high cost of producing the equipment. Practitioners have found it impractical to connect known converters in series for extending their range of operation, because of the high cost of the individual units.

It is an object of the invention to provide an analog to digital converter which overcomes one or more of the limitations and disadvantages of known converters.

It is another object of the invention to provide an analog to digital converter which is compact, and can be manufactured in a simple and facile manner at low cost.

It is still another object of the invention to provide an analog to digital converter which utilizes an easily constructed magnetic core as the principal active element.

It is a further object to provide an analog to digital converter which:

(1) Utilizes an analog signal to adjust the magnitude of magnetic flux in a flux path, and digital signals for saturating the flux path. The number of digital signals required for saturating the flux path is representative of magnitude of the analog signal.

(2) Utilizes an analog signal for adjusting the effective magnetic cross section of a flux path, thus determining the number of increments of flux that are required to be added to flux path to saturate its effective cross section, the number of increments being representative of the magnitude of the analog signal.

(3) Has the ability to operate with a continuously or intermittently applied analog signal.

(4) Converts analog signals to digital representations where the rate of change in the curvature of the analog signal is slow as compared to the repetition rate of digital signals derived from the converter, which can be very high.

Briefly, the preferred embodiment of the present invention comprises a magnetic core in which are defined a first and a second flux path, the second flux path being included within the first. The converter also includes means, comprising windings coupled to the first flux path for first saturating it and then reversing the flux in a section, common to both the first flux path and the second, by applying an analog signal to a winding. The extent of the flux reversal is related to the magnitude of the analog signal. Provision is also made for applying digital signals to a winding which is coupled to the second flux path only. Each such digital signal produces a small flux change in the second flux path tending to restore the section to its previous saturated condition. The number of digital signals required to accomplish a complete restoration is indicative of the magnitude of the analog signal. Finally, there is provided means for converting each partial flux changes in the second flux path to an electrical output signal. The number of electrical output signals thus reflects the magnitude of the analog signal.

The novel features that are considered characteristic of the invention are set forth in the appended claims; the invention itself, however, both as to its organization and method of operation, together with additional objects and advantages thereof, will best be understood from the following description of a specific embodiment when read in conjunction with the accompanying drawings in which:

FIG. 1 is a circuit diagram, partly schematic and partly in block form, of an analog to digital converter embodying the principles of the present invention;

FIG. 2 contains fragmentary views of a transfluxor core showing flux conditions in one of its flux paths under several conditions;

Figure 1:
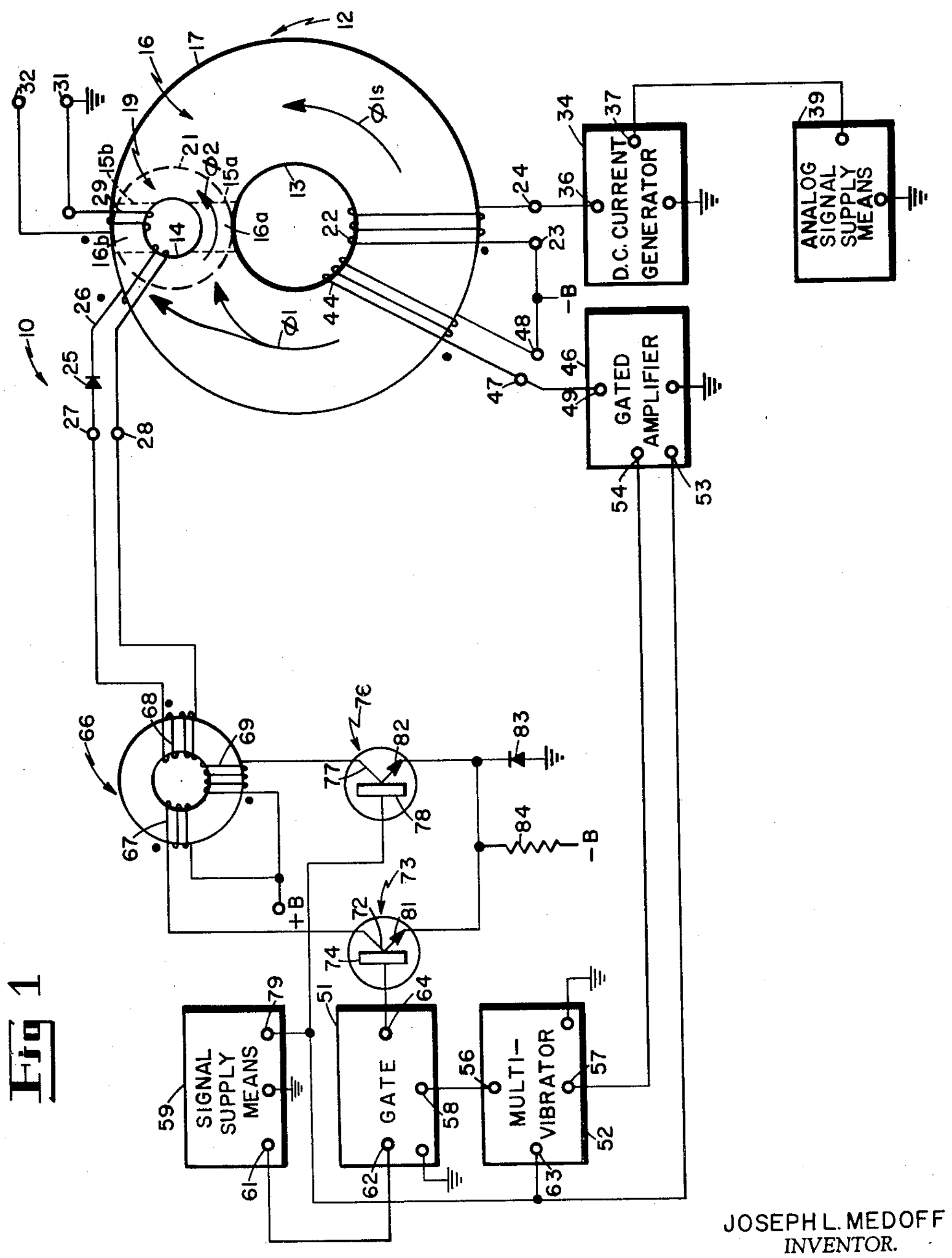

*Description of the FIG. 1 Analog to Digital Converter*

Referring to FIG. 1 of the drawings there is represented therein a circuit diagram, partly schematic and partly in block form, of an analog to digital converter embodying the principles of the present invention. The converter, generally designated 10, comprises means defining a first and second flux path, the second being wholly included within the first. Preferably, the means containing the flux paths comprises a transfluxor core 12 comprising a central aperture 13 and an off center aperture 14. The core material may be a ferrite, or a ferromagnetic material commonly used in computer applications. The specified arrangement of apertures 13 and 14 is illustrative, there being other configurations which are satisfactory for performing the functions to be described. The first flux path 16, comprises an annular section defined between the center aperture 13 and an outer marginal edge 17 of the transfluxor core 12. A second flux path 19, comprises an annular section defined by the aperture 14 and the dashed line 21. It will be noted that the annular section 19 is wholly included within the first flux path 16, and includes two sections **16*a* and 16*b*, which are substantially parallel to the first flux path 16. These sections, 16*a* and 16*b*, are delineated by the dashed lines 15*a* and 15*b***.

It is not an object of this discussion to describe in detail the theory of the operation of the transfluxor core 12. An excellent discussion on this subject is found in an article published in the Proceedings of the I.R.E., March 1956, by J. A. Rajchman, and A. W. Lo. In this discussion, there will be described a novel construction and application utilizing the transfluxor core discussed by the authors of the aforementioned article which results in an efficient and reliable analog to digital converter. Only those operating characteristics of the transfluxor core which are necessary for clarity and understanding of this invention will be described herein.

The analog to digital converter also includes means for inducing flux in the first flux path, the means being adapted for first saturating the first flux path and then adjusting the magnitude of the flux in section 16*a* as a function of the analog signal. The above described means is illustrated in FIG. 1 as two separate and distinct windings 22 and 44. This approach is used to simplify the description of the operation of the converter 10. It will be clear to one skilled in the art that the functions of first saturating the first flux path 16 and then adjusting the magnitude of flux therein as a function of the analog signal may be performed by a single winding by either sharing the time it is used for either function or superimposing a saturating signal on the analog signal therein. The function of saturating the first flux path 16 is performed by winding 44, whose extremities are terminated in terminals 47 and 48. The function of adjusting the flux as a function of the analog signal is performed by winding 22 which is terminated in terminals 23 and 24. Terminal 23 is coupled to terminal 48 and both are connected to a source of negative potential —B.

The analog signal originates in an analog signal supply means 39 which does not form a part of the converter 10 but represents any suitable signal source. The analog signal supply means 39 is coupled through an input terminal 37 of a D.C. current generator 34. The D.C. current generator 34, which is adapted to be coupled through an output 36 to terminal 24 of winding 22 is provided to generate a current, proportional to the analog signal, that is capable of energizing the winding 22 without distorting or loading down the analog signal. It follows, therefore, that the only requirement of the DC current generator 34 is that it have a linear relationship between its input circuit and its output circuit. One such generator may be an emitter follower having the winding 22 coupled to its collector circuit and having as its input circuit its base.

To provide a signal for saturating the first flux path 16 there is provided a gated amplifier 46 which includes an output terminal 49 that is coupled to terminal 47 of the winding 44.

The converter 10 also includes means for coupling unidirectional signals in the second flux path 19 for restoring the flux in the section 16*a* to the initial saturated state by incremental flux changes, after the flux in the section 16*a* has been adjusted to the level determined by the analog signal. This coupling means comprises a winding 26 which links the second flux path 19 in the manner shown in FIG. 1. One extremity of winding 26 is connected to a terminal 28. The other is coupled through a diode 25 to terminal 27.

The converter 10 also includes means coupled to the second flux path for converting the incremental flux changes induced in the second flux path by winding 26 to output signals. This means comprises a winding 29 wound around the annular section defining the second flux path 19. Winding 29 is terminated in a terminal 31 which is connected to a ground potential and a terminal 32 which may be coupled to an external utilization device.

As will be shown hereinafter, for selected types of signals, the transfluxor core 12 and the windings 22, 26, 29 and 44 can per se operate as an analog to digital converter. However, in practice the available signals are generally derived from voltage sources or, if they are obtained from current sources, they do not have sufficient power to operate the transfluxor core 12. Accordingly, there are provided in the converter 10 components such D.C. generator 34, which implement the transfluxor core 12 for signals of a general nature. Another implement device of this type comprises the toroidal core 66, its associated windings 67, 68, 69 and a pair of amplifiers generally designated 73 and 76. The winding 68 is coupled to terminals 27 and 28 at the input of the coupling means for translating unidirectional signals to the second flux path 19. The winding 67 comprises an input winding for the toroidal core 66, and the winding 69 comprises a reset winding. One end of each of the windings 67 and 69 are connected to a source of positive potential +B. The other ends of these windings are coupled to the collectors 72 and 77 respectively of the amplifiers 73 and 76. These amplifiers 73 and 76 are normally biased to cut off by connecting their emitters 81 and 82 respectively through a resistor 84 to a source of negative potential —B. A diode 83 is connected between the emitters and ground for preventing the emitters from going more negative than ground potential.

The converter 10 includes control means for governing the sequence of events which takes place during a conversion operation. In the converter 10, the control signals are digital in nature and originate in a signal supply means 59. For purposes of this discussion the signal supply means 59 is shown as part of the analog to digital converter 10. However, it will be obvious to one skilled in the art that digital signals of the type required in the converter 10 may be available in many of the digital apparatus with which the converter 10 may be called upon to operate. The signal supply means 59 includes an output terminal 61 for supplying digital signals to a gate 51. Similar digital signals, although delayed in time, are secured from a second terminal 79 of the signal supply means 59. The delayed signals are coupled from terminal 79 to the base 78 of the amplifier 76, to an input terminal 53 of the gated amplifier 46 and to an input terminal 63 of a multivibrator 52.

The multivibrator 52 comprises the primary timing element for the converter 10. It is preferably a free running type which is operated in synchronism with the digital signals applied thereto, in the manner described in paragraph 1810 on page 408 of the first edition of a text by S. Seely, entitled "Electronic Tube Circuits." The text is published by the McGraw-Hill Publishing Company. Output signals from the multivibrator 52 are obtained from a pair of terminals 56 and 57. These signals have opposite polarities. Terminal 57 is coupled to the gated amplifier 46 for controlling the on-off time of the amplifier. Terminal 56 of the mutivibrator 52 is coupled to terminal 58 of the gate 51 and provides a second input signal for the gate 51. Gate 51 is conventional in construction and design and may be a form of the well known diode "and" gates.

Associated with each of the windings described in the foregoing description is a dot shown at one end of the winding. The dot, as is conventional, indicates the polarity of the winding. For example, if current is assumed to be flowing into terminal 27 of winding 26, by convention, a voltage is induced in the winding 29 which will cause a current to leave terminal 32 of winding 29. To further assist in the understanding of the flux gyrations, the direction of the windings on the cores 12 and 66, shown in the drawings are consistent with the polarity designated by the dots.

*Theory of Operation*

To make the mode of operation of the analog to digital converter more understandable, the operation of the transfluxor will be briefly discussed. Reference will be made to FIGS. 1 through 4 of the drawings during the explanation.

In FIG. 1 of the drawings, a bifurcated arrow, designated $\phi 1$, represents direction taken by the flux induced in the first flux path 16 by the winding 44. It will be noted that flux $\phi 1$ divides into two parts designated $\phi 1a$ and $\phi 1b$ and passes through sections 16*a* and 16*b*, respectively, of the first flux path 16. The counterclockwise arrow designated $\phi 1s$ denotes the direction taken by the flux induced in the first flux path 16 by the winding 22. The arrow, situated within the second flux path 19, and pointing in a counterclockwise direction is designated $\phi 2$ and represents the direction taken by the flux induced in the second flux path 19 by signals applied to winding 26.

Figure 2:
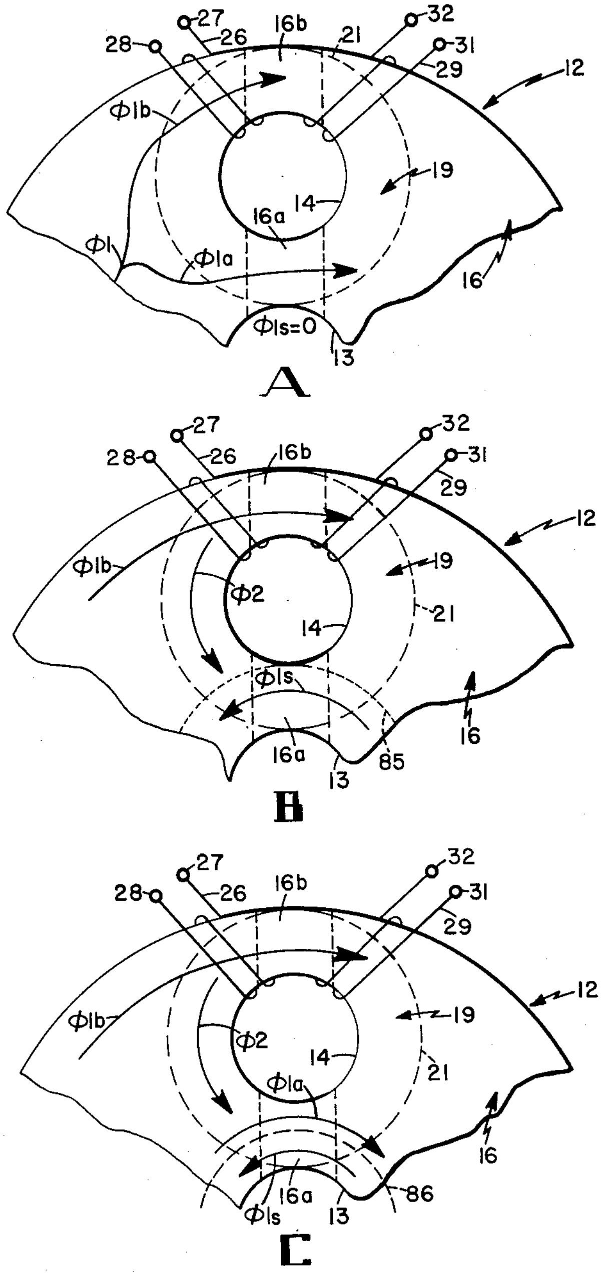

Enlarged fragmentary views of the transfluxor core 12 in the region of the small aperture 14 are represented in A, B and C of FIG. 2. The fragmentary views serve to illustrate several flux distribution states to which the transfluxor core may be set and their effect on the efforts of winding 26 to induce a flux $\phi 2$ in the second flux path 19. In the normal operation of the transfluxor, and its preferred mode of operation for purposes of this invention, the flux $\phi 1$ is initially increased in magnitude until sections 16*a* and 16*b* of the first flux path 16 are saturated. This condition is represented by arrows $\phi 1a$ and $\phi 1b$ shown passing through sections 16*a* and 16*b*. Considering for the moment a current in winding 26 tending to increase the flux in the counterclockwise direction, it is obvious that this objective can not be accomplished because the $\phi 1a$ flux in section 16*a* has wholly saturated that section thus preventing any further increase in flux therein. Assuming now that the current in winding 26 is of a polarity that will induce a flux in a clockwise direction, it will be apparent that this attempt will also fail because the $\phi 1b$ flux in section 16*b* has previously saturated that section. Consequently, regardless of the polarity of the current flowing in winding 26, the magnitude of the flux within the second flux path 19 can not be changed. Accordingly, an output signal from winding 29 can not be obtained because, as it is well known, a change of flux is required to induce a voltage in a winding coupled to a flux path. The transfluxor core 12 is, under these conditions, said to be blocked signifying that for signals applied to winding 26 there will be no output signals generated at winding 29. In the blocked condition the entire cross sectional area of section 16*a* has been saturated in the same direction as section 16*b*.

The transfluxor core 12 may also be placed in an unblocked condition, so named because $\phi 1s$ has saturated section 16*a* in a direction opposite to that of section 16*b*. See view B of FIG. 2. Under these conditions the flux in the second flux path 19 now takes on the appearance of a normal unidirectional flow of flux in a simple toroid, namely all flux flowing in the same direction. Consider now the effect of a positive signal applied to terminal 27 of winding 26. The flux $\phi 2$ induced in the second flux path 19, as a consequence of this signal, is in a counterclockwise direction, as indicated by the arrow. The flux $\phi 2$ tends to reverse the $\phi 1b$ and $\phi 1s$ flux existing in the second flux path 19 under unblocked conditions. As there is nothing to prevent a reversal of this flux a change in the magnitude and direction occurs. This change of flux induces a signal in the winding 29 which links the second flux path 19. It will be remembered, that under unblocked conditions, the flux in the second flux path 19 flowed in a clockwise direction. If we assume $\phi 2$ to be of sufficient magnitude, it will completely reverse the direction of flux in the second flux path. Clearly, where $\phi 2$ completely reverses the direction of flux in the second flux path 19, the reversal occurs over the entire cross sectional area of the section 16*a*.

Referring now to view C of FIG. 2, the flux flowing in the second flux path 19 represents a condition in between the two extreme conditions, blocked and unblocked, previously described. In view C, section 16*b* is saturated by the flux $\phi 1b$. In 16*a*, it is seen that $\phi 1s$ has not completely reversed $\phi 1a$. For purposes of illustration it will be assumed that $\phi 1s$ is flowing in $\frac{3}{5}$ of the cross sectional area of section 16*a*. The dash line 86 delineates between the portions of section 16*a* which include flux $\phi 1a$ and $\phi 1s$. To restore section 16*a* to a saturated state it is merely necessary to reverse the flow of flux in the portion which carries $\phi 1s$.

It will now be shown that the distribution of $\phi 1s$ is in section 16*a* may be controlled by controlling the flux induced in the first flux path 16 by the analog signal. A fundamental magnetic relationship is that $$H=\frac{kI}{l} \tag{1}$$

where $H$=the magnetomotive force induced in the first flux path 16

$k$=a constant determined by the number of turns of the winding inducing H, in this case winding 22

$I$=the current flowing in that winding, in this case current derived from the analog signal and $l$=the length of the magnetic path, first flux path 16.

If the flux path is annular, as the first flux path 16 is, $$H=\frac{kI}{2\pi r} \tag{2}$$

where $r$=the radial distance from the center of the aperture 13.

Figure 4:
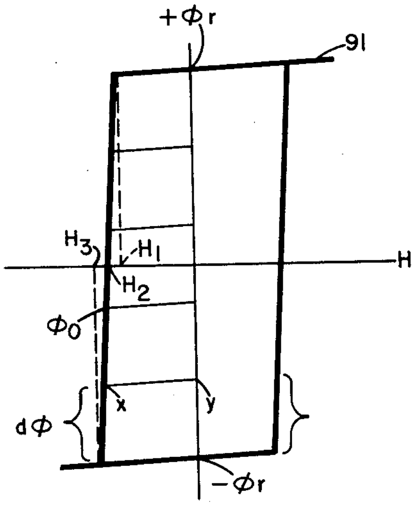
FIG. 4 is a representation of a hysteresis loop which is also useful in explaining the operation of the invention.

Referring briefly to FIG. 4 of the drawings, there is shown a hysteresis loop 91 which can be used to illustrate the mechanism of setting the magnitude of flux $\phi 1s$. As is well known a hysteresis curve represents a relationship of the flux density flowing in the flux path as a function of H. However, since the flux density is directly related to the flux where the cross sectional area of the flux path is constant, the latter designation will be used.

After the first flux path 16 is saturated, both sections 16*a* and 16*b* are magnetically set to a saturated remanent point, $+\phi r$ on curve 91, for example. As the analog current in winding 22 is increased, H increases towards the left, as viewed in FIG. 4, through $H_1$, $H_2$ and finally to $H_3$. At $H_3$ a complete reversal in flux has taken place. It is clear, however, from Equation 2 that the intensity of H varies inversely as the radial distance $r$. If the transfluxor core material has a substantially rectangular hysteresis curve, as shown in curve 91, as is usual in this type of application, a small change in H, from $H_1$ to $H_3$, is required to completely reverse the flux. It also follows from the relationship between H and $r$ that $\phi 1s$ can be made to penetrate across the width of section 16*a* to any extent. It is possible, therefore, for a given magnitude of I to have flux in adjacent portions of a flux path going in opposite directions.

The $\phi 1s$ penetration in section 16*a* can also be characterized by hysteresis curves which represent the flux condition existing in the second flux path 19, considered alone, after the flux in the second flux path 19 has been set by the analog signal. In other words, hysteresis curves can reflect the degree of penetration of $\phi 1s$.

Figure 3:
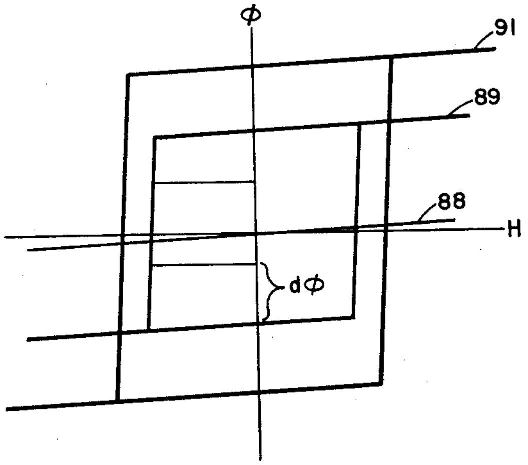
FIG. 3 is a representation of a series of hysteresis loops which are useful in explaining the operation of the analog to digital converter.

In FIG. 3 of the drawings there are represented three idealized hysteresis loops, each taken for a different setting of $\phi 1s$, shown in FIG. 2. Curve 88 in FIG. 3 represents the hysteresis condition existing in the second flux path 19 for a blocked transfluxor core as shown in view A of FIG. 2. It is seen that there is substantially no vertical dimension, indicating that flux changes within this core are impossible. Curve 89 represents a hysteresis loop showing the condition in the section 16*a* wherein a $\phi 1s$ flux corresponding to view C in FIG. 2, exists, and curve 91 represents a completely unblocked form as represented in view B of FIG. 2.

It is apparent, from the foregoing, that a signal in winding 22, which determines the magnitude of $\phi 1s$ also determines the height of the hysteresis loop for the second flux path 19. Accordingly, if the signal which generates $\phi 2$ is not large enough to saturate section 16*a*, and merely increases the flux therein by an increment, the number of such increments required to saturate the section will depend on the height of the hysteresis loop. For example, referring to FIG. 4 of the drawings, there is shown therein hysteresis loop 91 representing condition B of FIG. 2 wherein $\phi 1s$ has completely reversed the flux in section 16*a*. Magnetically, therefore, section 16*a* is at the positive remanent point, designated $+\phi r$. If we assume that each signal applied to winding 26 produces a change of flux equal to $d\phi$ (see FIG. 4) it will take five such changes changes to completely reverse the direction of flux flow in the second flux path bringing it to its negative remanent point, designated $-\phi r$. Manifestly, in the case of hysteresis loop 89, only three changes of flux in the second flux path would reverse the direction.

The operation of the digital to analog converter 10 makes use of the above described property of the transfluxor core. The analog signal determines the magnetic state of the second flux path and consequently, the number of digital signals required to saturate the path.

As a practical matter, before applying a signal to generate a set flux, the first flux path 16 is blocked. This step is in the nature of providing a reference level from which the set flux can act. The remanent points of a core are specific and the core may be repeatedly set to either remanent condition very reliably. There are numerous ways and means for providing a flux of an absolute magnitude in the core. However, because of the hysteresis effect these procedures are not reliable and often times inaccurate. In practice, it has been found desirable to set a core to a remanent condition in order to establish an accurate initial operating condition.

*Operation of FIG. 1 Analog to Digital Converter*

Figure 5:
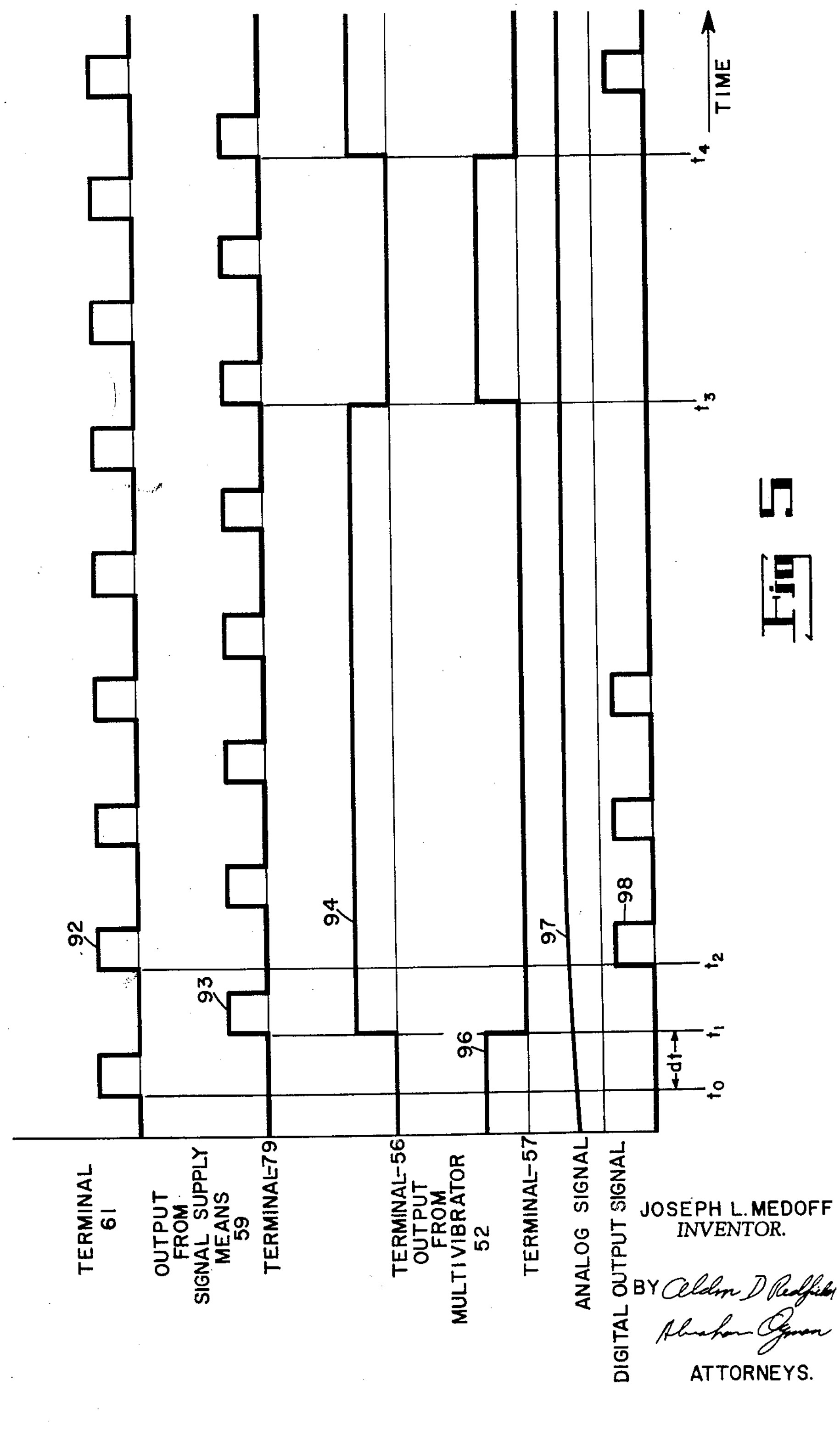
FIG. 5 is a representation of a group of curves showing the time relationship between signals employed in the FIG. 1 analog to digital converter.

During the discussion of the operation of the analog to digital converter 10 reference will be made to FIG. 1 through FIG. 5 of the drawings. In FIG. 5 there are represented a group of curves showing signals used in operating the converter 10. Curve 92 represents a digital signal wherein the pulses recur periodically. Curve 93 illustrates another digital signal, substantially identical to the signal shown in curve 92 except that these signals have been delayed in time by an interval *dt*. The signals in curve 92 are obtained from terminal 61 of the signal supply means 59 and the signals in curve 93 are obtained from the terminal 79 of the signal supply means 59.

The curve designated 94 represents a positive enabling signal whose duration is equal to five times the spacing between the individual signals in curve 93. The curve designated 96 shows another positive enabling signal having a duration equal to two times the spacing between the signals in curve 93. Curves 94 and 96 are derived in the sequence shown from terminals 56 and 57 respectively, of the multivibrator 52.

The curve designated 97 denotes a portion of an analog signal. Normally, the duration of the enabling signals 94 and 96 will be extremely short when compared with the rate of change of the slope of the analog signal. Accordingly, the amplitude of curve 97 will be constant during the duration of an enabling signal. This constancy is substantially as shown in curve 97. A slight slope is illustrated therein to provide a visual indication of the analog signal as a signal which varies with time.

Initially, the converter 10 is adjusted as follows. At time $t_0$ the enabling signal 96 has activated the gated amplifier 46. A digital signal from terminal 79 is amplified and translated through the gated amplifier 46 and applied to the winding 44 (see FIG. 1). The amplified signal in winding 44 acts to increase the magnitude of the flux $\phi 1$ until the first flux path 16*a* and 16*b* included therein, are saturated, at $+\phi r$. It will be noted from FIG. 1 that the analog signal supply means 39 is, during this interval, supplying the analog signal to the D.C. current generator 34 and then to the winding 22. It is clear that the presence of the analog signal in winding 22 is attempting to create the flux $\phi 1s$. However, the magnitude of the amplified digital signal in winding 44 is sufficient to swamp out, or nullify the flux inducing effect of winding 22.

A conversion is initiated at time $t_1$ when the enabling signal 96 drops to zero and deactivates the gated amplifier 46. When the gated amplifier 46 is deactivated the analog signal is able to create a flux $\phi 1s$ in the first flux path 16, and in the section 16*a*, in the manner previously discussed.

Also, at time $t_1$ a digital signal derived from curve 93 is applied from the signal supply means to the base 78 of the amplifier 76. This digital signal is amplified and applied to winding 69 on the toroidal core 66. This amplified signal in the winding 69 induces flux within the core 66 of sufficient magnitude and of the proper polarity to saturate the core 66. In this discussion it will be assumed that the core 66 at this time is saturated in a negative direction, and inducing a negative signal in winding 68 in the process. The operation just discussed is a resetting action for placing the toroidal core 66 in condition for translating a digital signal to the transfluxor core 12. It will be noted that a signal is not translated to the transfluxor 12 because, the translation of this negative signal is blocked by the diode 25 which is poled to permit the translation of the positive signals. At time $t_2$ a pulse, from curve 92, is applied from the signal supply means 59 to the gate 51. Since the enabling signal 94, which was generated in the multivibrator 52 at time $t_1$ is still present, and since it is coupled through terminal 56 of the multivibrator to terminal 58 of the gate 51, at time $t_2$, when the digital signal arrives at terminal 62 of the gate 51, it can pass through the base 74 of the amplifier 73. The amplified signal is coupled from the amplifier 73 to winding 67 and causes a positive signal to be developed in winding 68. The positive signal is translated through the diode 25 to winding 26 on the transfluxor core 12.

It is noted that the digital signals to the converter are in the nature of voltage pulses. These voltage pulses are converted by the core 66 to current pulses having the correct waveshape for driving the transfluxor 12. It is recognized that incremental changes in flux may be generated in the transfluxor core by a properly shaped signal applied directly to the winding 26 thereon. However, the purpose of providing the core 66 is to make absolutely certain that these incremental flux changes are of equal magnitude. The core 66 makes available at the input to winding 26 a current signal whose magnitude is constant, since the current signal developed in the core 66 is generated by a complete reversal of flux in the core 66, from one saturated state to another.

Continuing our assumption that the analog signal has initially set the flux in section 16*a* to the condition shown in view C of FIG. 2, the following sequence of events will take place as the digital signals are applied through the core 66 to the winding 26 and then to the flux generated in the second flux path 19. Since $\phi 1s$ has penetrated to the extent of 3/5 of the width of section 16*a* the second flux path is operating under conditions represented by the hysteresis loop 89 in FIG. 3. Since the height of loop 89 is 3/5 of the height of the loop 91 (FIG. 4) it will take only three changes in flux ($d\phi 1$) to reverse the flux $\phi 1s$ until the section 16*a* is once again saturated in the direction that it was originally blocked by flux $\phi 1a$. Another way of looking at this same operation is to assume that section 16*a* was originally blocked to the positive saturated point $+\phi$. See FIG. 4. The flux $\phi 1s$ has carried the section 16*a* in a negative direction to the point $\phi_0$ on the hysteresis loop 91. The incremental flux changes in the section 16*a* caused by the digital signals act to reverse the action of the flux $\phi 1s$. It is clear from FIG. 4 that whereas it requires five such changes to block a completely unblocked core, it requires only three to accomplish the same purpose where the analog signal has induced the flux $\phi 1s$ that has penetrated the section 16*a* to the extent of 3/5 of its width.

In curve 98 of FIG. 5 the three output signals are represented. It will be noted that these signals occur early in the conversion operation, since section 16*a* is saturated by the third digital signal.

At time $t_3$, at the conclusion at the conversion interval, the multivibrator 52 once again reverses itself thereby removing the enabling signal from gate 51 and generating an enabling signal for the gated amplifier 46. In the manner previously described, a digital signal is amplified through the gated amplifier 46 and applied to winding 44 thus blocking the transfluxor core 12 and re-establishing reference magnetic state in the second flux path 19, prior to the next conversion cycle.

Figure 6:
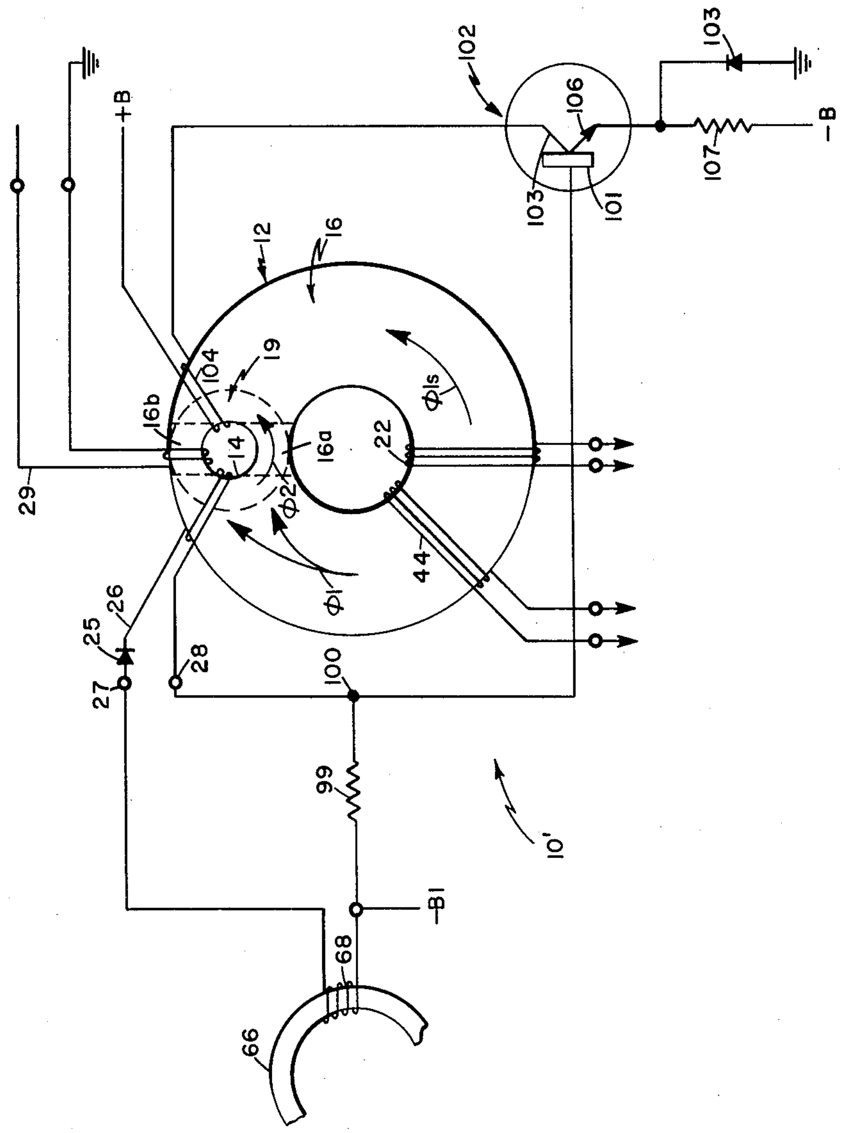
FIG. 6 is a schematic circuit diagram of a portion of an analog to digital converter, which includes means for resetting the converter.

*Description and Operation of the FIG. 6 Analog to Digital Converter*

It was previously pointed out, from Equation 1, that H is inversely proportional to *l*. Normally the transfluxor core 12 is constructed so that the ratio of the lengths of the first to the second flux path is large so that the flux variations in the second flux path 19 do not affect the status of the flux induced in those portions of the first flux path 16 which are remote from the aperture 14. It is possible to remove the analog signal from the winding 22 shortly after the analog signal has supplied the flux $\phi 1s$ in the first flux path 16, thus making it possible to use the converter with apparatus requiring that the analog signal be sampled. In the interval between sampling periods the transfluxor core 12 stores the last applied analog signal in the form of flux $\phi 1$. A detailed explanation of this operation will be presented hereafter.

In accordance with another feature of this invention means may be provided for automatically resetting the flux in the second flux path 19 if a saturated condition therein has been reached. Briefly, the resetting mechanism acts on the principle that the impedance of a coil wound on a magnetic core drops substantially to zero when the core is magnetized.

Referring to FIG. 6 of the drawings there is shown a fragmentary view of an analog to digital converter generally designated 10′ in which there is provided an automatic resetting mechanism. Numeral designations applied to parts in the FIG. 1 converter have been retained for identical parts shown in FIG. 6.

The automatic resetting means comprises a transistor amplifier designated 102 in series with a winding 104 which is coupled to the second flux path 19. The transistor amplifier 102 comprises a collector 103 which is coupled to one side of the winding 104. The other side of winding 104 is coupled to a source of positive potential +B. The transistor amplifier 102 also comprises an emitter 106 which is coupled through resistor 107 to a source of negative potential −B. A diode 108 is connected between an emitter 106 and ground for preventing the emitter from reaching a negative potential greater than ground. A base 101 in the transistor amplifier 102 is coupled to the junction 100 between terminals 28 of winding 26 and a resistor 99. The other end of resistor 99 is connected to winding 68. A source of negative potential $-B_1$ is connected to the winding 68 side of resistor 99 for biasing the transistor amplifier 102 to a cut off condition.

From FIG. 6 it is seen that a signal generated in winding 68 is applied across the winding 26, and the resistor 99 in series. That the magnitude of the applied signal impressed across each of these elements is directly proportional to the magnitude of the impedances of these elements is well known. It is also well known that the impedance of a winding on a magnetic core is substantially higher when the core is unsaturated than when the core is in a saturated condition. For purposes of this invention the unsaturated impedance of winding 26 is adjusted to be about ten times greater than the resistance of the resistor 99. Accordingly, only ten percent of the signal obtained from winding 68 appears across resistor 99 when the second flux path 19 is unsaturated. On the other hand substantially the entire signal obtained from winding 68 appears across resistor 99 when the second flux path 19 is saturated.

Figure 7:
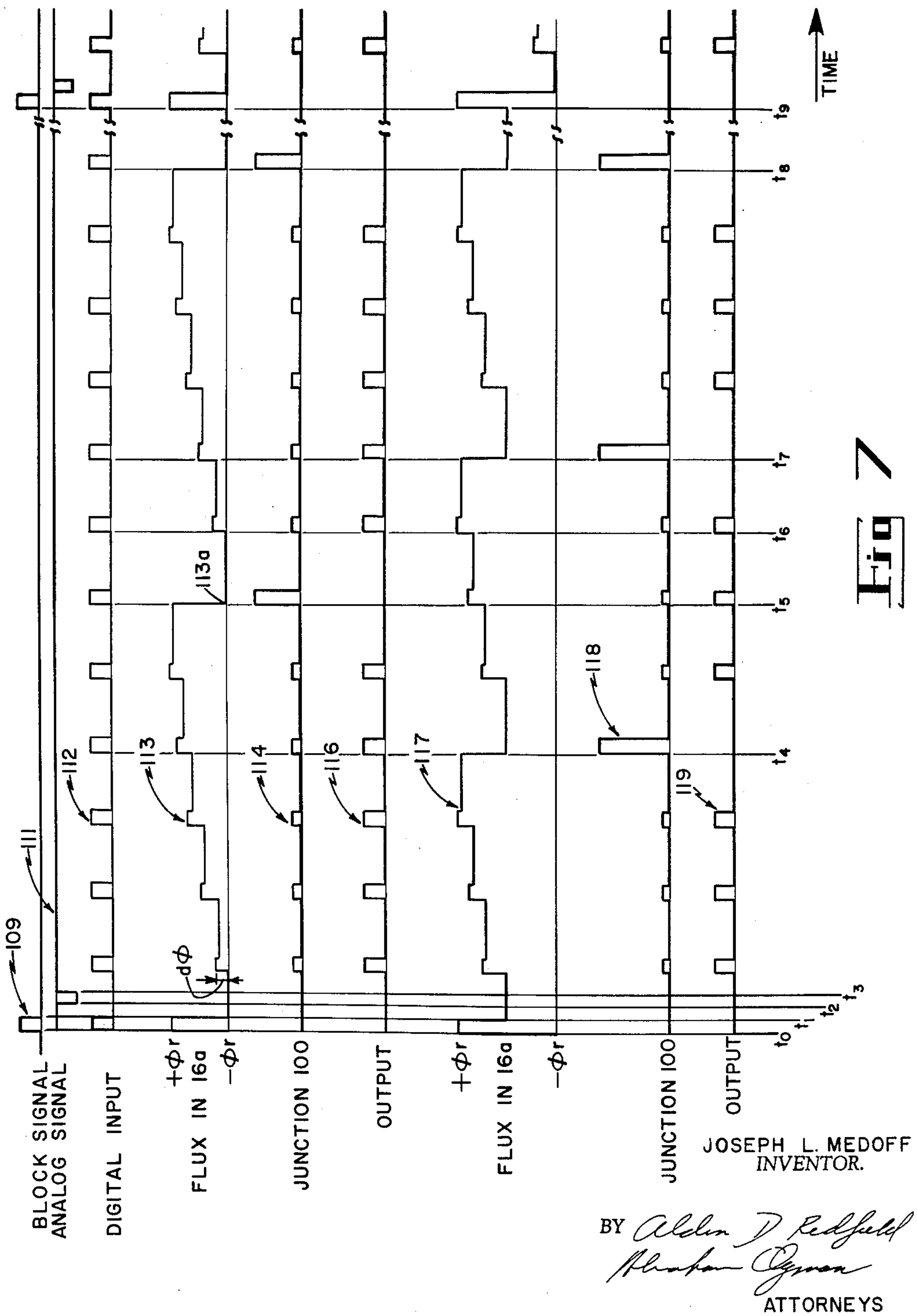
FIG. 7 is a representation of a group of curves which are used to illustrate the reset feature of the FIG. 6 circuit.

The operation of the automatic reset mechanism and a description of the operation of the computer when a momentary analog signal is supplied will be discussed with reference to FIG. 6 and the curves shown in FIG. 7. In FIG. 7 there is represented a group of curves denoting the time relationship of several of the signals supplied to and generated within the analog to digital converter 10′. In curve 109 is shown a core blocking pulse which is applied to terminal 47 of winding 44 as previously described. Curve 111 represents the instantaneous magnitude of an analog signal during a sampling period. The analog signal is applied to terminal 24 on winding 22. The unidirectional periodic signal shown in curve 112 represents the digital signals obtained from the output winding 68 on core 66 and applied to winding 26. Curve 113 represents the magnitude of the flux flowing in the direction of $\phi 1a$ in section 16*a* of the second flux path 19 as a function of time. The voltage appearing at junction 100, or in other words appearing across resistor 99, is shown in curve 114. The unidirectional signals shown in curve 116 represent the output signals obtained from the output winding 29 of the converter 10′. In curve 117 the magnitude of the flux $\phi 1a$ appearing in section 16*a* as a function of time is shown under initial conditions other than those assumed for curve 113. The potential appearing at junction 100 as a function of time, under the operating conditions existing for curve 117 is represented in curve 118. Finally in curve 119, the output signals from the converter 10′, under the conditions existing for curve 117, are illustrated.

In accordance with the preferred mode of operating the analog to digital converer 10′ the first step is to block the transfluxor core to establish a definitive reference level. Accordingly at time $t_0$ in FIG. 7 a pulse, curve 109, is applied to terminal 47 of winding 44 saturating the first and second flux path 16 including sections 16*a* and 16*b*. At time $t_1$ the blocking signal is removed and an analog signal is applied to winding 22 as shown in curve 111. In the manner heretofore described the analog signal reverses the flux in the first flux path 16 and in section 16*a* in particular. Referring now to curve 113 in FIG. 7 the large positive signal between times $t_0$ and $t_1$ represents the saturated state of the first and second flux paths. The reduction in the amplitude of the curve 113 between the time intervals $t_1$ to $t_2$ indicates the extent to which the flux in section 16*a* has been reduced by $\phi 1s$ derived from the analog signal shown in curve 111. In this case the core has been completely unblocked.

At time $t_3$ a digital signal is generated in winding 68 and translated through diode 25 to the winding 26 and resistor 99 in series. Since the second flux path 19 is not saturated most of the applied signal is impressed across the winding 26 thereby inducing in the second flux path 19 an increment of flux $d\phi$ shown on curve 113. Recalling the discussion on the operation of the FIG. 1 converter, and referring to FIG. 4, it is seen that the flux increment $d\phi$ represents a positive increase in the flux in the second flux path 19. In curve 113 this is reflected by a vertical shortly after time $t_3$ in the flux of section 16*a*. At the conclusion of the digital pulse the magnitude of the flux decreases slightly and remains at this lower amplitude. The decrease arises by virtue of the fact that the top of the hysteresis loop, see FIGS. 3 and 4, is not horizontal but is slightly inclined. The decrease would correspond to the drop in flux from point "*x*" in FIG. 4 to point "*y*" where "*y*" represents the incremental remanent condition. The events just described are repeated and each of the four following signals developed in winding 68. The fifth signal saturates the second flux path 19, and the next succeeding pulse will not cause an incremental increase in flux in this path. Also, as a result of the saturated condition, the impedance of the winding 26 drops to zero. Consequently, the first pulse occurring after the second flux path has been saturated, at time $t_5$ is wholly impressed across resistor 99. This signal is of sufficient magnitude and of the proper polarity to overcome the bias of the transistor amplifier 102 activating at the amplifier. The amplified signal in the collector 103 is applied across the reset winding 104 coupled to the second flux path 19. The effect of this signal in winding 104 is to reset the magnitude of the flux in the second flux path 19 to the value that it initially had as indicated at point 113a on curve 113. At time $t_6$ the next digital signal from winding 68 is applied to winding 26 and an increment of flux is added to the second flux path 19, in the manner heretofore described. The steps for saturating the second flux path 19 in the interval from $t_3$ to $t_5$ are repeated in the interval between $t_6$ to $t_8$, at which time the second flux path 19 again becomes saturated and is reset. At time $t_9$ which occurs at some indefinite time after $t_8$, the transfluxor core 12 is blocked once again in preparation for the next sample of the analog signal.

Curves 117 through 119 illustrate the operation of the automatic reset mechanisms for a different initial condition of flux in section 16a of the second flux path 19. As seen at $t_2$, it is assumed that the flux has reached a magnitude of $\phi 1$ as a result of first blocking the transfluxor core 12 and then being reversed by the analog signal. The first three digital signals applied to winding 26 increase the flux in section 16a incrementally as previously described. However, since these increments add to flux $\phi 1$, the section 16a saturates at the end of the third increment. The first reset pulse occurs at time $t_4$ as shown in curve 118.

The amplified reset signal may be large enough to set section 16a to the positive remanent condition, $\phi r$; however, it is not capable of doing this since section 16b saturates at the precise point at which 16a is set to the level determined by $\phi 1s$. The events of the first cycle are repeated in the time interval between $t_4$ and $t_7$ and again in the time interval $t_7$ and $t_8$. In each of these cycles the output signal comprises three unidirectional pulses, see curve 119. It will be noted that the three cycles are identical indicating that the flux in the first flux path did not undergo a change either due to a blocking action or a change of analog signal. However, at time $t_9$ a blocking signal, applied to winding 44 for example, occurs which saturates section 16a. It is followed by an analog signal which completely reverses the flux in 16a from the positive saturated remanent $+\phi r$ to the negative remanent condition $-\phi r$. The events occurring after the core has been set in this manner will be identical to the events previously described for curves 113, 114 and 116.

From the foregoing it is clear that it is not necessary to have a constant application of the analog signal to the transfluxor core 12. The provision of an automatic reset mechanism will provide periodic indications of the magnitude of the last analog signal applied to the core. To record a change in the analog signal, or to merely ascertain whether a change has taken place, it is merely necessary to block the transfluxor core and reintroduce the analog signal for a short period of time.

In the entire discussion of the analog to digital converter 10′ nothing was said of the circuits required to introduce the blocking the signal and the analog signal. In view of the previous discussion outlining a suitable control system for the FIG. 1 converter 10, it will be a simple matter for one skilled in the art to provide control means for the converter 10′.

The simplicity of the subject invention in terms of mechanical and electrical components makes it possible to cascade a number of similar units to extend the range beyond that which is available for a single unit. Reliable operation is an inherent feature of this invention because the signals relied upon to perform the operation are not critical. That is, it is merely necessary to note the presence or absence of the signal in order to operate the converter. The only signal whose amplitude must be accurately determined is that of the analog signal since it it necessary to subtract the flux generated by it, $\phi 1s$ from the remanent flux, $\phi 1$, of the transfluxor core.

Clearly, if the digital input signals and the analog signal were capable of driving the transfluxor core 12, it would be possible to dispense with the core 66 and its related circuits, and the D.C. circuit amplifier. The conversion takes place directly in the transfluxor core providing unidirection signals only translated to winding 26.

The various features and advantages of this invention are thought to be clear from the foregoing description. Various other features and advantages not specifically enumerated will undoubtedly occur to those versed in the art, as likewise will many variations and modifications of the preferred embodiment illustrated, all of which may be achieved without departing from the spirit and scope of the invention as defined by the following claims.

I claim:

1. A converter for converting digital signals to a digital representation of an analog signal comprising: means defining a first flux path; means defining a second flux path within said first flux path which includes sections parallel to said first flux path; means for first saturating said first flux path and then adjusting the magnitude of flux in one of the sections as a function of the analog signal; means for applying unidirectional digital signals to said second flux path for restoring the flux in the one section to the saturated state by incremental flux changes; and means coupled to said second path for converting the incremental flux changes to output signals whereby the number of output signals is representative of the magnitude of the analog signal.

2. A converter as described in claim 1 which includes in addition means for resetting the flux in said one section to the level established therein by the analog signal.

3. A converter for converting digital signals to a digital representation of an analog signal comprising: a magnetic core having a first and second flux path defined therein, said second flux path being within said first flux path and including sections parallel to said first flux path; means for first saturating said first flux path and then adjusting the magnitude of flux in one of the sections as a function of the analog signal; means for applying unidirectional digital signals to said second flux path for restoring the flux in the one section to the saturated state by incremental flux changes, and means coupled to said second path for converting the incremental flux changes to output signals whereby the number of output signals is representative of the magnitude of the analog signal.

4. A converter as described in claim 3 in which said magnetic core is a transfluxor.

5. A converter as described in claim 3 in which said magnetic core is cylindrical and defines a central and an off-center aperture, said first flux path comprising an annular section of said core, the inner edge of which coincides with the marginal edge of the central aperture, said second flux path comprising an annular section of the first flux path the inner edge of which coincides with the marginal edge of the off-center aperture.

6. A converter as described in claim 5 in which the off center aperture is spaced centrally within said annular section comprising the first flux path.

7. A converter for converting digital signals to a digital representation of an analog signal comprising; means defining a first and second flux path, the second path being wholly contained in the first and including sections parallel to said first flux path; analog signal supply means; means including a first winding coupled to said analog signal supply means for developing a flux in one of the sections whose magnitude is representative of the magnitude of the analog signal means including; a second winding for coupling unidirectional digital signals to said second flux path for changing the flux therein in increments, the accumulated incremental flux changes when added to the flux developed by the analog signal saturating said one section; and a third winding coupled to said second flux path for converting the incremental changes in flux to digital output signals whereby the number of the electrical signals is representative of the analog signal.

8. A converter for converting digital signals to a digital representation of an analog signal comprising: means defining a first and second flux path, the second path being included within the first and including sections parallel to said first flux path; analog signal supply means; means including a first winding coupled to said analog signal supply means for developing a flux in one of the sections whose magnitude is representative of the magnitude of the analog signal; a second winding for coupling digital signals to said second flux path for changing the flux therein in increments, the accumulated incremental flux changes when added to the flux developed by the analog signal saturating the one section; a third winding coupled to said second flux for converting the incremental changes in flux to digital output signals; and means for automatically resetting the magnitude of flux in the one section to the level determined by the analog signal after said one section is saturated.

9. A converter as described in claim 8 in which said reset means comprises a reset winding coupled to said second flux path, and a resistor in the digital signal path, said resistor being coupled to the reset winding for translating a digital signal to said reset winding for inducing flux in said second flux path for returning the flux in the one section to the level determined by the analog signal.

10. A converter for converting digital signals to a digital representation of an analog signal comprising: a first and second flux path, said second flux path being included in the first and including sections parallel to said first flux path; means for first saturating said first flux path and then adjusting the magnitude of flux in one of the sections as a function of the analog signal; means for coupling digital signals to said second flux path; signal supply means coupled to the last mentioned means for providing a signal for changing the flux in the one section in increments; and means coupled to said second flux path responsive to the incremental flux changes therein for developing electrical signals, the number of which is representative of the magnitude of the analog signal.

11. A converter as described in claim 10 which in addition includes means for resetting the flux in said one section to the level determined by the analog signal.

12. A converter as described in claim 10 which in addition includes means for automatically resetting the flux in said one section to the level determined by the analog signal when said one section is saturated.

13. A converter for converting digital signals to a digital representation of an analog signal comprising: means defining a first flux path; means defining a second flux path within said first flux path which includes sections parallel to said first flux path; means coupled to said first flux path for adjusting the magnitude of flux therein as a function of the analog signal; coupling means for applying unidirectional digital signals to said second flux path for saturating a section of said second flux path by incremental flux changes; and means coupled to said second flux path for converting the incremental flux changes to output signals whereby the number of output signals is representative of the magnitude of the analog signal.

References Cited in the file of this patent

UNITED STATES PATENTS

| | | |
|---|---|---|
| 2,700,501 | An Wang | Jan. 25, 1955 |
| 2,905,834 | Arsenault et al. | Sept. 22, 1959 |

OTHER REFERENCES

Proceedings of the IRE, "The Transfluxor," Rajchman and Lo, March 1956, pages 321–332.

UNITED STATES PATENT OFFICE

CERTIFICATE OF CORRECTION

Patent No. 3,068,462 December 11, 1962

Joseph L. Medoff

It is hereby certified that error appears in the above numbered patent requiring correction and that the said Letters Patent should read as corrected below.

Column 1, lines 16 and 17, strike out "digital converter which overcomes one or more of the limited in its application.", and insert instead -- signal. For obvious reasons this type of converter is limited in its application. --; column 3, line 68, after "such" insert -- as --; column 5, line 74, strike out "is"; column 6, line 73, before "hysteresis loop" insert -- a --; column 7, line 4, strike out "changes"; column 8, line 65, after "such" insert -- flux --; column 10, line 30, for "converer" read -- converter --; column 11, line 62, strike out "the", second occurrence; column 12, line 2, for "since it it necessary" read -- since it is necessary --; column 13, line 21, after "flux" insert -- path --.

Signed and sealed this 28th day of May 1963.

(SEAL)

Attest:

ERNEST W. SWIDER

Attesting Officer

DAVID L. LADD

Commissioner of Patents